United States Patent
Hotta

[11] Patent Number: 5,831,930
[45] Date of Patent: Nov. 3, 1998

[54] SEMICONDUCTOR MEMORY DEVICE WITH ADDRESS SIGNAL TRANSITION DETECTION

[75] Inventor: Yasuhiro Hotta, Nara, Japan

[73] Assignee: Sharp Kabushiki Kaisha, Osaka, Japan

[21] Appl. No.: 713,458

[22] Filed: Sep. 13, 1996

[30] Foreign Application Priority Data

Sep. 13, 1995 [JP] Japan .................................. 7-235743

[51] Int. Cl.$^6$ ........................................................ G11C 8/00
[52] U.S. Cl. ........................... 365/233.5; 365/230.06
[58] Field of Search ....................... 365/233.5, 230.06

[56] References Cited

U.S. PATENT DOCUMENTS

| | | | |
|---|---|---|---|
| 4,271,487 | 6/1981 | Craycraft et al. ................... | 365/189.11 |
| 4,581,718 | 4/1986 | Oishi ................................... | 365/230.08 |
| 4,710,648 | 12/1987 | Hanamura et al. ................... | 365/212 |
| 4,744,063 | 5/1988 | Ohtani et al. ........................ | 365/233 |
| 4,922,122 | 5/1990 | Dubujet ................................ | 307/408 |
| 5,159,574 | 10/1992 | Kim et al. ........................... | 365/233.5 |
| 5,264,737 | 11/1993 | Oikawa ................................ | 307/265 |
| 5,305,284 | 4/1994 | Iwase .................................. | 365/238.5 |
| 5,313,436 | 5/1994 | Matsubishi .......................... | 365/233.5 |
| 5,483,498 | 1/1996 | Hotta .................................. | 365/233.5 |

FOREIGN PATENT DOCUMENTS 6-104406  4/1994  Japan .

Primary Examiner—Joseph A. Popek
Assistant Examiner—Michael T. Tran
Attorney, Agent, or Firm—Morrison & Foerster LLP

[57] ABSTRACT

A semiconductor memory device includes a plurality of memory cells for storing data and a selector for selecting at least one memory cell from the plurality of memory cells based on an address signal. The semiconductor memory device includes a transient detecting unit for outputting a first signal in accordance with a transient of the address signal; and a generator for generating a second signal indicating a wait for accessing a memory cell based on the first signal and a clock signal.

3 Claims, 10 Drawing Sheets

FIG. 14A

| S | Φ | D | Q |
|---|---|---|---|
| H | X | X | H |
| L | ↗ | L | L |
| L | ↗ | H | H |
| L | ↘ | X | No change |

FIG. 14B

| R | Φ | D | Q |
|---|---|---|---|
| H | X | X | R |
| L | ↗ | L | L |
| L | ↗ | H | H |
| L | ↘ | X | No change |

SEMICONDUCTOR MEMORY DEVICE WITH ADDRESS SIGNAL TRANSITION DETECTION

BACKGROUND OF THE INVENTION

1. Field of the Invention:

The present invention relates to a semiconductor memory device which confirms the end of access cycle by outputting a stand-by signal to a microprocessor or the like.

2. Description of the Related Art:

With a recent tendency toward a high speed microprocessor, a semiconductor memory device is also required to have an improved access speed. High speed access of a semiconductor memory device refers not only to an improvement of access speed during a normal random access but also to an attainment of an access speed greater than that of the normal access mode by employing a high speed access mode such as a page mode or a burst mode.

The structure of a conventional typical ROM (Read Only Memory) using a page mode will be described as follows with reference to FIG. 6.

The ROM shown in FIG. 6 has a plurality of bit lines B (B generically refers to $B_{i0}$, $B_{i1}$, ... $B_{ik}$) formed in the vertical direction and a plurality of row selection lines WL (WL generically refers to $WL_j$) formed in the horizontal direction. Each intersection of the bit line and the row selection line is provided with a cell transistor QM serving as a memory cell (QM generically refers to $QM_0$–$QM_k$).

The gate terminal of the cell transistor QM is connected to the adjacent row selection line WL, and the drain terminal of the cell transistor QM is connected to the corresponding bit line B. The source terminal of the cell transistor QM is grounded. The choice of the terms "drain" and "source" is arbitrary in that the terminal connected to the bit line B can be referred to as the source and the grounded terminal can be referred to as the drain.

Those cell transistors QM lining up in the same row all have their gate terminals connected to the same row selection line WL, and those cell transistors QM lining up in the same column (not shown in the figure) all have their drain terminals connected to the same bit line B. The cell transistor QM is formed such that when it stores "0" data, its threshold voltage $V_{th}$ becomes the same as the threshold voltage of a regular enhancement FET. By applying High level voltage to the gate terminal, the cell transistor QM becomes ON. When the cell transistor QM stores "1" data, its threshold voltage $V_{th}$ is equal to or greater than the power source voltage. Even if High level voltage is applied to the gate terminal of the cell transistor QM, the cell transistor QM does not become ON. In FIG. 6, only the following are illustrated: one row selection line $WL_j$, k+1 number of bit lines $B_{i0}$–$B_{ik}$ which can continuously be read in a page mode and k+1 number of cell transistors $QM_0$–$QM_k$ provided at the intersections of the row selection line $WL_j$ and the bit lines $B_{i0}$–$B_{ik}$.

Each of the above-mentioned bit lines B is connected to a sense amplifier 101 through an MOS transistor QC (QC generically refers to $QC_{i0}$–$QC_{ik}$). For every one bit of data $D_i$, k+1 number of these sense amplifiers 101 are provided. The gate terminals of the MOS transistors QC forming a group of k+1 number of transistors are all connected to the same column selection line C (C generically refers to $C_i$). Each sense amplifier 101 is connected to a corresponding bit line B through a corresponding MOS transistor QC connected to a corresponding column selection line C. In FIG. 6, the bit lines $B_{i0}$–$B_{ik}$ are connected to the sense amplifiers 101 through the MOS transistors $QC_{i0}$–$QC_{ik}$, respectively, where the MOS transistors $QC_{i0}$–$QC_{ik}$ are all connected to the row selection line $C_i$.

The output terminal of each of the sense amplifiers 101 is connected to a common output buffer 102 through an MOS transistor QP (QP generically refers to $QP_0$, $QP_1$, ..., $QP_k$) Each MOS transistor QP has its gate terminal connected to one of the k+1 number of data selection lines P. Here, k refers to either 0 or a positive integer. A group set of the MOS transistors $QP_0$, $QP_1$, ..., $QP_k$ performs a role as a multiplexer which sends out an output signal from one of the sense amplifiers 101 to the output buffer 102. The output buffer 102 is an output circuit for sending out one bit of data $D_i$ which is amplified by one of the sense amplifiers 101.

The operation of the ROM shown in FIG. 6 will be described as follows with reference to FIG. 7.

As illustrated in FIG. 7, when the address signal becomes valid at time $t_1$, the high order bits of this address signal are decoded so as to select one row selection line WL and one column selection line C, and the row selection line WL and the column selection line C become at the High level. FIG. 7 illustrates the case where the above-mentioned row selection line $WL_j$ and column selection line $C_i$ have been selected by the valid address signal.

In the case where "0" data are stored in the cell transistors $QM_0$–$QM_k$, each of the cell transistors $QM_0$–$QM_k$ connected to the selected row selection line $WL_j$ becomes ON state. Because of this, the voltage of the corresponding bit lines $B_{i0}$–$B_{ik}$ makes a gradual transition to the Low level (low voltage level). In the case where "1" data are stored in the cell transistors $QM_0$–$QM_k$, the cell transistors $QM_0$–$QM_k$ become OFF state at all times. Because of this, the voltage of the corresponding bit lines $B_{i0}$–$B_{ik}$ makes a gradual transition to the High level.

Each of the sense amplifiers 101 connected to the bit line B through each of the MOS transistors $QC_{i0}$–$QC_{ik}$ amplifies a voltage in each of the bit lines $B_{i0}$–$B_{ik}$. A logic level of each of the cell transistors $QM_0$, $QM_1$, ..., $QM_k$ becomes valid, and the sense amplifiers 101 output read-out data S (S generically refers to $S_{i0}$–$S_{ik}$) stored in the cell transistors. A certain amount of time is required until the logic level becomes valid. In a case of a normal access mode, a certain data selection line, for example only the data selection line $P_0$ becomes at the High level. For this reason, the read-out data $S_{i0}$ is sent out to the output buffer 102 through the MOS transistor $QP_0$. The read-out data $S_{i0}$ are output as data $D_i$ at time $t_2$. Later, by successively bringing the data selections lines $P_1$–$P_k$ to the High level, one of the read-out data $S_{i1}$–$S_{ik}$ from the sense amplifiers 101 is output from the output buffer 102 in the order of the read-out data $S_{i1}$–$S_{ik}$ as the data $D_i$ at times $t_3$, $t_4$, etc.

In the normal access mode, the time interval between time $t_1$ and time $t_2$ includes the time required for determining the logic levels of the data $S_{i0}$–$S_{ik}$ read out by the sense amplifiers 101. Here, $t_2$ is the time when the address signal for selecting the cell transistor becomes valid in a normal access mode, and $t_2$ is the time when the data $D_1$, which are the read-out data $S_{i0}$–$S_{ik}$, are output in a normal access mode. A relatively long time interval $T_N$ is required until the logic levels for data $S_{i0}$–$S_{ik}$ become valid.

Data stored in the cell transistors can be read out in a high speed access mode which is the page mode where data are continuously read out in high speed in units of pages. Once data are read out in the normal access mode, the successive k number of read-out data $S_{i1}$–$S_{ik}$ are made valid by the sense amplifiers 101. Therefore, by selecting one of the data selection lines $P_1$–$P_k$, the data $D_i$ can be output during the time interval $T_p$. Such high speed access mode is not limited for the above-mentioned ROM and can be employed in other semiconductor memory devices such as an EEPROM (Electrically Erasable Programmable ROM) or a DRAM (Dynamic Random Access Memory).

However, in a system using a semiconductor memory device with the above-mentioned high speed access mode, it is necessary for the microprocessor to access the memory device while considering the access mode at all times. For example, in a case where the microprocessor performs high speed access on the above-mentioned semiconductor memory device, it is necessary to examine whether addresses to be successively made valid are within the same page of k+1 number or less and to change the access mode accordingly depending on the result of this examination. This makes the accessing procedure troublesome.

Moreover, in one semiconductor memory device, in a case where the semiconductor memory device examines fixed address signals, automatically switches between the high speed access mode and the normal access mode, and performs accessing in the normal access mode, the semiconductor memory device outputs a stand-by signal (READY signal, WAIT signal) to instruct the microprocessor or the like to wait.

The structure of the ROM which outputs the above-mentioned stand-by signal will be described as follows with reference to FIG. 8.

An address signal consists of first group bits ($A_{i+1}$–$A_j$) and second group bits ($A_0A_i$). The first group bits $A_{i+1}$–$A_j$ of the address signal are sent to an X decoder 3 and a Y decoder 4 through a first group address input circuit 1. The X decoder 3 is a circuit which decodes upper address (row address) of the first group bits $A_{i+1}$–$A_j$ of the address signal and selects the above-mentioned row selection lines WL. The Y decoder 4 is a circuit which decodes the lower address (column address) of the first group bits $A_{i+1}$–$A_j$ of the address signal and selects the above-mentioned column selection lines C.

The second group bits $A_0$–$A_i$ of the address signal are decoded by a second group address input circuit 2 and sent to a multiplexer 7. This multiplexer 7 corresponds to the circuit of MOS transistors $QP_0$–$QP_k$ illustrated in FIG. 6. A sense amplifier group 6 and an output circuit 8 also correspond to the plurality of sense amplifiers 101 and the output buffer 102 illustrated in FIG. 6.

In the normal access mode, the sense amplifier group 6 reads out a plurality of data D from a memory array 5 by addressing the first group bits $A_{i+1}$–$A_j$ of the address signal. Then, a set of data $D_0D_n$ selected by the multiplexer 7 is output through the output circuit 8.

In the high speed access mode, by successively switching only the second group bits $A_0$–$A_i$ of the address signal, the multiplexer 7 successively outputs data through the output circuit 8, which have already been read out to the sense amplifier group 6. Row addresses and column addresses output from the first group address input circuit 1 are also sent to an address transient detection circuit 9.

Hereinafter, the operation of the address transient detection circuit 9 will be described with reference to FIGS. 9 and 10. Each of the first group bits $A_{i+1}$–$A_j$ of the address signal is input to a corresponding match detection circuit 91. Output signals from the match detection circuits 91 are input to a multi-input NOR circuit 95. An output signal from the multi-input NOR circuit 95 becomes the address transient detection signal ATD bar. The match detection circuit 91 makes an output from the exclusive OR circuit 91b at the High level only for the delay period predetermined by a delay circuit 91a only when at least one of the bits $A_{i+1}$–$A_j$ of the address signal changes. That is, the multi-input NOR circuit 95 outputs the address transient detection signal ATD bar at the High level (active) when at least one of the output signals from the match detection circuit 91 is at the High level. The address transient detection signal ATD bar is input to a circuit 98 of the address transient detection circuit 9 illustrated in FIG. 10.

Hereinafter, operation of the circuit 98 will be described with reference to FIG. 10.

The circuit 98 receives the address transient detection signal ATD bar. In the circuit 98, the address transient detection signal ATD bar is divided in two so that one of them is delayed by a delay circuit 96 and input to an AND circuit 97 and the other is input to the AND circuit 97 with no delay. The AND circuit 97 performs AND logic operation on the address transient detection signal ATD bar and the delayed address transient detection signal. The AND circuit 97 outputs the result of the AND logic operation as a stand-by signal MISS bar.

The delay circuit 96 and the AND circuit 97 are circuits for stretching the pulse width of signal (the address transient detection signal ATD bar) which is input to the address transient detection circuit 9. The delay circuit 96 and the AND circuit 97 transform the address transient detection signal ATD bar having relatively narrow pulse width into the stand-by signal MISS bar having a pulse width sufficiently longer than the access time in the normal access mode. The stand-by signal MISS bar is output from the address transient detection circuit 9 shown in FIG. 8.

Hereinafter, the relationship between the standby signal MISS bar and the time in the normal access mode will be described with reference to FIG. 11.

At time $t_{11}$, the first group bits $A_{i+1}$–$A_j$ of the address signal change and the access in the normal access mode is performed. The stand-by signal MISS bar becomes at the Low level (active) at time $t_{12}$ shortly after the time $t_{11}$. At time $t_{13}$ which is well past the time $t_{12}$, data $D_0$–$D_n$ output from the output circuit 8 are fixed. At time $t_{14}$ shortly after the time $t_{13}$, the stand-by signal MISS bar returns to the High level.

Hereinafter, the relationship between the standby signal MISS bar and the time in the high speed access mode will be described with reference to FIG. 12.

In the high speed access mode, if the second group bits $A_0$–$A_i$ of the address signal are changed while the first group bits $A_{i+1}$–$A_j$ of the address signal are held constant, data $D_0$–$D_n$ output from the output circuit 8 successively become valid as illustrated in FIG. 12. That is, if only the second group bits $A_0$–$A_i$ of the address signal are successively changed while the first group bits $A_{i+1}$–$A_j$ of the address signal are held constant, the data $D_0$–$D_n$ can be successively and repeatedly output from the output circuit 8 in a relatively short time.

Therefore, by inputting the stand-by signal MISS bar to a READY bar terminal, a WAIT bar terminal, or the like of the microprocessor, data stored in the cell transistors can be read at high speed.

Hereinafter, an example of the timing for the above-mentioned ROM to read out data stored in the cell transistors using the stand-by signal MISS bar will be described with reference to FIG. 13.

If the level of the first group bits $A_{i+1}$–$A_j$ of the address signal changes during the first clock cycle period $T_1$, the stand-by signal MISS bar becomes at the Low level (active) after a certain period of time since the level changed. For example, when the clock cycle period $T_1$ ends, the microprocessor detects whether the level of the stand-by signal MISS bar is high or low. The microprocessor waits to receive the data D, when the level of the stand-by signal MISS bar is low.

In FIG. 13, the level of the stand-by signal MISS bar becomes high during the clock cycle $T_3$. The microprocessor reads out data D from the ROM after the cycle $T_3$ ends. Then, the microprocessor ends read-out operation of data D. For this reason, it is no longer necessary for the microprocessor to consider how long the access time of the ROM is.

In a case where the access in the high speed access mode is performed, since the stand-by signal MISS bar stays at the High level (inactive), the data $D_0$–$D_n$ can readily be read out. For this reason, the microprocessor can perform high speed access automatically when the conditions for the address signals are met without considering the access mode of the ROM.

SUMMARY OF THE INVENTION

According to one aspect of the present invention, a semiconductor memory device includes a plurality of memory cells for storing data and a selector for selecting at least one memory cell from the plurality of memory cells based on an address signal. The semiconductor memory device includes a change detecting unit for outputting a first signal in accordance with a change of the address signal; and a generator for generating a second signal indicating a wait for accessing a memory cell based on the first signal and a clock signal.

In one embodiment of the present invention, the generator includes at least two flip-flops.

In one embodiment of the present invention, the semiconductor memory device is an EEPROM.

In one embodiment of the present invention, the semiconductor memory device is a DRAM.

According to the semiconductor memory device of the present invention, since the counting means counts the external clock signals, the stand-by signal can be accurately made active for a valid amount of time. In a case where a period in which the stand-by signal is made active is made valid using the delay circuit having a combination of inverters as in the conventional art, it is necessary to design the delay time of the delay circuit longer than usual, considering the margin for deviation during production. On the other hand, if the time in which the stand-by signal is made active can be accurately counted as in the present invention, then this stand-by signal becomes active over a long period of time more than necessary and the microprocessor or the like does not have to waste its time while standing by.

For example, the semiconductor device of the present invention has both the normal access mode and the high speed access mode such as the page mode. The device makes the stand-by signal active only for the normal access mode having long access time. Moreover, in the semiconductor device of the present invention, the bits of address signal are divided into a first group and a second group. With the first group bits of the address signal, the data in the memory cells corresponding to, for example, one page can be read out all at once. In these cases, the time when the stand-by signal is made active can accurately be counted, and the microprocessor or the like does not have to waste its time while standing by.

These and other advantages of the present invention will become apparent to those skilled in the art upon reading and understanding the following detailed description with reference to the accompanying figures.

BRIEF DESCRIPTION OF THE DRAWINGS

FIGS. 14A and 14B are diagrams illustrating the operation of the flip-flops.

DESCRIPTION OF THE PREFERRED EMBODIMENTS

Figure 1:
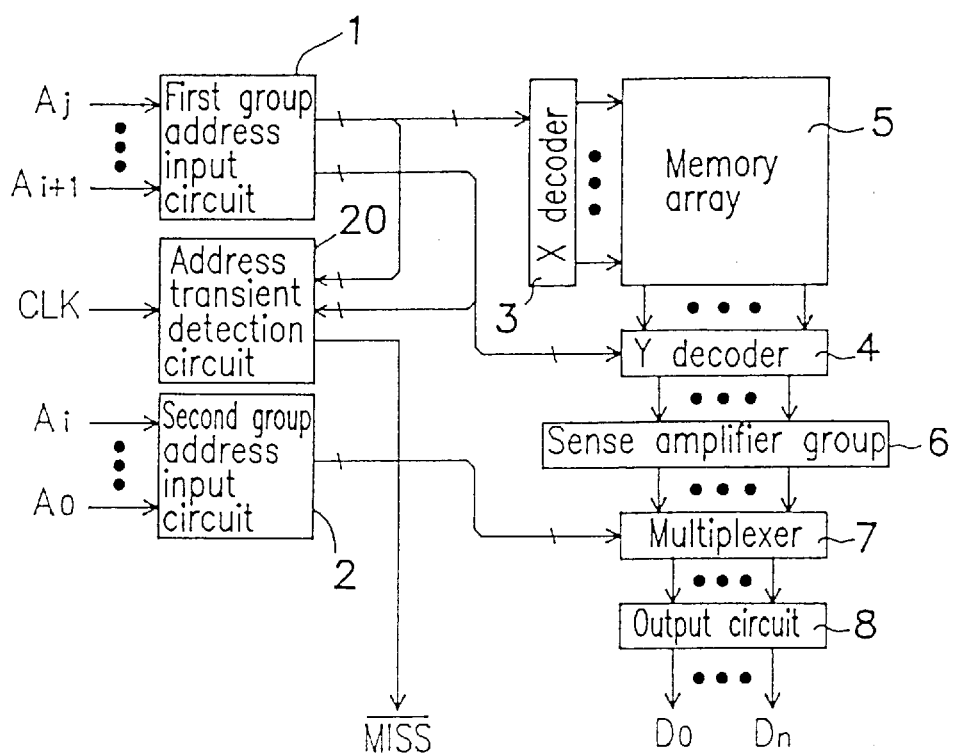
FIG. 1 is a block diagram illustrating the structure of a ROM capable of operating in the high speed access mode in one embodiment of the present invention.
Figure 8:
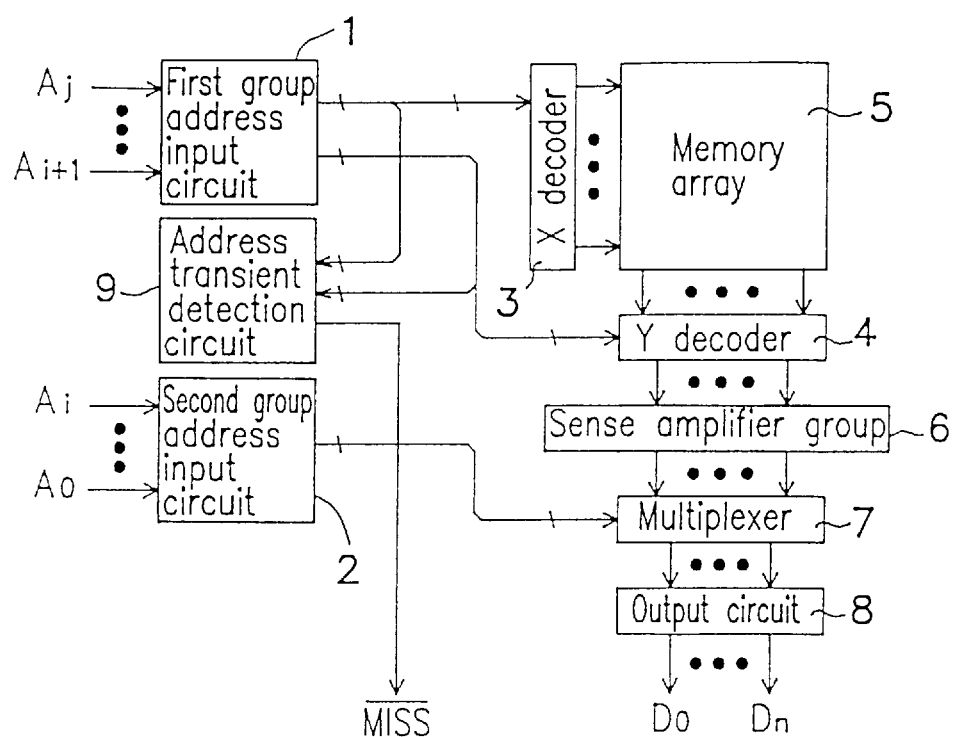
FIG. 8 is a block diagram illustrating the structure of the ROM capable of operating in the high speed access mode in the conventional example.

A semiconductor memory device illustrated in FIG. 1 has the same configuration as the semiconductor memory device shown in FIG. 8 except the address transient detection circuit 20. Like the semiconductor memory device in FIG. 8, the semiconductor memory device shown in FIG. 1 is capable of operating in the high speed access mode in which data stored in the cell transistors can be read at high speed in a page mode. The high speed access mode refers to an access mode in which data stored in the cell transistors are read out by changing only the second group bits $A_0$–$A_i$ of the address signal. On the other hand, the normal access mode refers to an access mode in which data stored in the cell transistors are read out by changing the first group bits $A_{i+1}$–$A_j$ of the address signal.

Those parts having the same structure will be designated by the same reference numerals, and the descriptions thereof will be omitted. The address transient detection circuit 20 is a circuit which generates a stand-by signal MISS bar and outputs it to outside, for example to a microprocessor or the like. The structure of the address transient detection circuit 20 will be described in detail later.

Hereinafter, the operation of the semiconductor memory device according to the present invention will be described with reference to FIG. 1.

In the description of the semiconductor memory device shown in FIG. 1, an address signal of j+1 bits $A_0$–$A_j$ is considered. High order bits of the address signal are referred to as a first group bits $A_{i+1}$–$A_j$ of the address signal, and low order bits of the address signal are referred to as a second group bits $A_0$–$A_i$ of the address signal. Although the high order bits and low order bits of the address signal are referred to as the first group address signal and the second group address signal, respectively, in this specification, this naming may be reversed.

The first group bits $A_{i+1}$–$A_j$ of the address signal are input to the first group address input circuit 1, and the second group bits $A_0$–$A_i$ of the address signal are input to the second group address input circuit 2. The first group bits $A_{i+1}$–$A_j$ of the address signal input to the first group address input circuit 1 are further divided into upper address of the first group bits (row address) and lower address of the first group bits (column address). The row address and the column address are sent to the X decoder 3 and the Y decoder 4, respectively.

The data stored in the memory cell connected to the word line selected by the X decoder 3 and connected to the bit lines selected by the Y decoder are read out from the memory array 5 to the sense amplifier group 6. The sense amplifier group 6 amplifies the received data. The sense amplifier group 6 inputs the amplified data to the multiplexer 7 as an output signal S.

The multiplexer 7 outputs only a signal selected from the input signals to the output circuit 8 based on the second group bits $A_0$–$A_i$ of the address signal input to the second group address input circuit 2.

The first group bits $A_{i+1}$–$A_j$ of the address signal output from the first group address input circuit 1 is also sent to the address transient detection circuit 20. The address transient detection circuit 20 receives the first group bits $A_{i+1}$–$A_j$ of the address signal and the clock signal CLK. The clock signal CLK may be supplied from the outside of the semiconductor device shown in FIG. 1.

Hereinafter, the structure and operation of the address transient detection circuit 20 will be described with reference to FIGS. 2 and 3.

Figure 2:
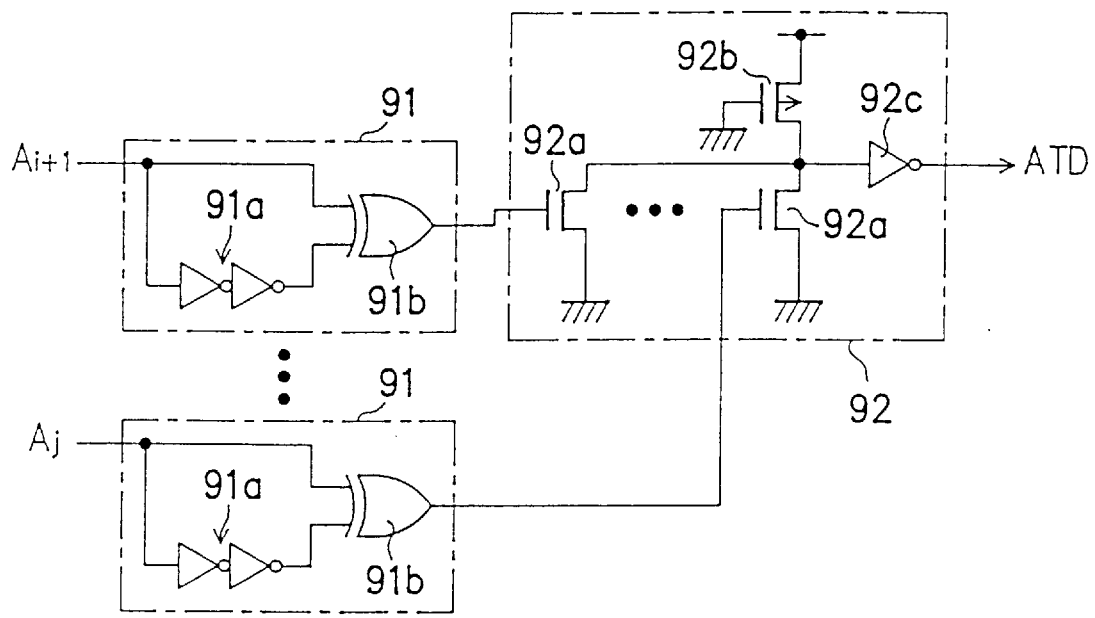
FIG. 2 is a block diagram illustrating the structure of the address transient detection unit in the address transient detection circuit in one embodiment of the present invention.
Figure 3:
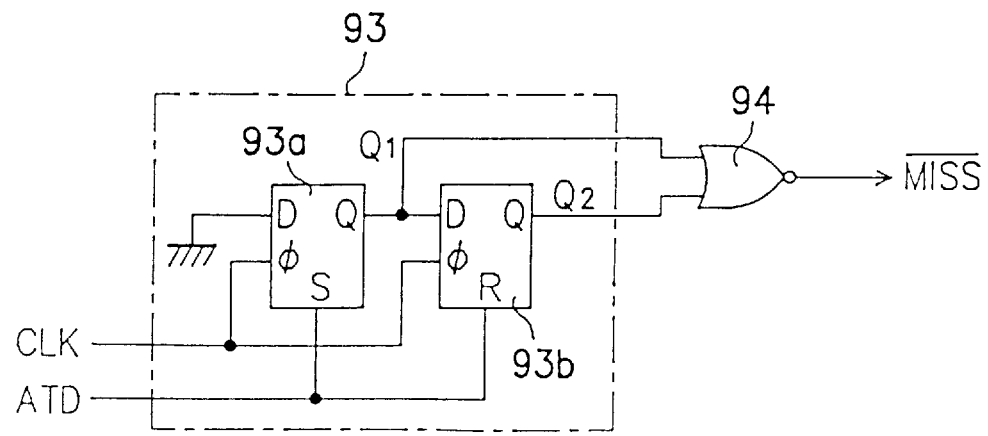
FIG. 3 is a block diagram illustrating the structure of the stand-by signal generating unit in the address transient detection circuit in one embodiment of the present invention.

The address transient detection circuit 20 includes match detection circuits 91 and a multi-input OR circuit 92 as shown in FIG. 2 and a generator circuit 93 and a NOR circuit 94 as shown in FIG. 3. Each match detection circuit 91 has a delay circuit 91a in which a plurality of inverters are combined and an exclusive OR circuit 91b. The first group bits $A_{i+1}$–$A_j$ of the address signal are input to the address transient detection circuit 20. Each of the input first group bits $A_{i+1}$–$A_j$ of the address signal is input to the match detection circuit 91. When at least one bit of the first group bits $A_{i+1}$–$A_j$ of the address signal changes, the level of the output signal from the exclusive OR circuit 91b becomes at the High level only for a delay period predetermined by the delay circuit 91a.

Moreover, the multi-input OR circuit 92 has a plurality of N channel MOS transistors 92a, a P channel MOS transistor 92b for pull-up and an inverter 92c. Each of the output signals from the match detection circuits 91 is input to the multi-input OR circuit 92.

The multi-in put OR circuit 92 outputs an address transient detection signal ATD which is either a high level signal or a low level signal based on the output signals from the match detection circuits 91. If at least one of the output signals from the match detection circuits 91 is at the High level, the High level of the address transient detection signal ATD is output.

As described above, the address transient detection circuit 20 also has the generator circuit 93 and the NOR circuit 94. Hereinafter, the structures and operations of the generator circuit 93 and the NOR circuit 94 will be described with reference to FIG. 3.

The generator circuit 93 has a flip-flop 93a and a flip-flop 93b which are of the same kind. The relationship of input/output of the flip-flops 93a and 93b is illustrated in FIGS. 14A and 14B, respectively. In FIGS. 14A and 14B, H and L represent high levels and low levels, respectively, and X represents all the signals (high level signals, low level signals, etc.). In FIG. 14B, R in the column Q indicates that the value of the column R, i.e., the high level signal in this case, is output from the Q terminal.

The data input terminal D of the flip-flop 93a is grounded. The data input terminal S of the flip-flop 93a receives the address transient detection signal ATD. The input terminal φ of the flip-flop receives the clock signal CLK. The flip-flop 93a outputs an output signal from the data output terminal in accordance with the rise of the clock signal CLK.

Since Low level voltage is applied to the data input terminal D, if the address transient detection signal ATD becomes at the High level, the flip-flop 93a sets the output signal Q1 from the flip-flop 93a to the High level ("to set" means to make the output from the terminal Q at the high level).

When the output signal Q1 is input to the data input terminal D of the flip-flop 93b, the address transient detection signal ATD becomes at the High level and the clock signal CLK rises, then the flip-flop 93b resets to make the output signal Q2 at the Low level ("to reset" means to make the output from the terminal Q at the low level).

In these flip-flops 93a and 93b, the clock signal CLK is input to the clock input terminal φ. This clock signal CLK is counted. The output signals Q1 and Q2 from the flip-flops 93a and 93b, respectively, are input to the NOR circuit 94, and the output signal from the NOR circuit 94 becomes the stand-by signal MISS bar. That is, the stand-by signal MISS bar becomes at the High level (active) when either of the output signals Q1 or Q2 of the flip-flops 93a and 93b, respectively, is at the High level.

Figure 4:
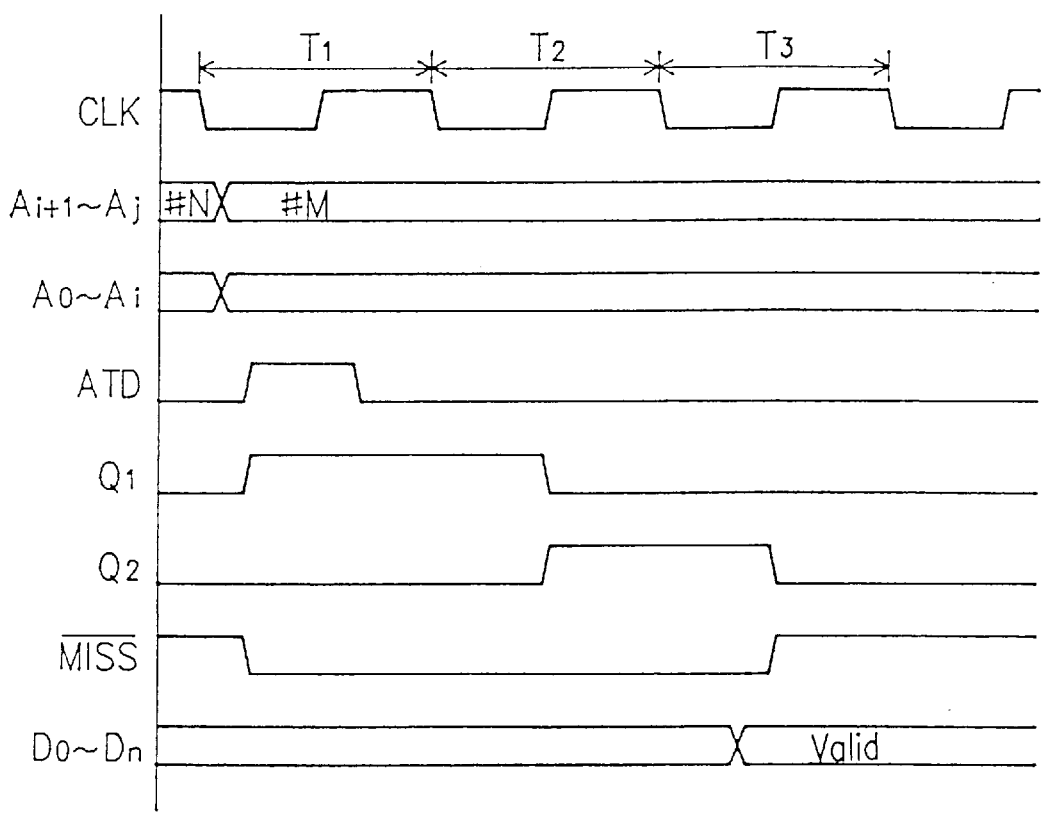
FIG. 4 is a timing chart illustrating the operation of each clock cycle in the normal access mode in one embodiment of the present invention.

Hereinafter, the clock cycle of the semiconductor memory device shown in FIG. 1 in the normal access mode will be described with reference to FIG. 4.

During the first clock cycle period $T_1$, the first group bits $A_{i+1}$–$A_j$ and the second group bits $A_0$–$A_i$ of the address signal change. Since at least one bit of the first group bits $A_{i+1}$–$A_j$ changes when the address signal changes from "#N" to "#M", the output signal from at least one of the match detection circuits 91 in the address transient detection circuit 20 becomes at the High level (# is a symbol indicating that numbers or characters following the # is a hexadecimal number). For this reason, the address transient detection signal ATD output from the multi-input OR circuit 92 becomes at the High level for a predetermined period of time.

Due to the change that the address transient detection signal ATD becomes at the High level, the flip-flop 93a in the generator circuit 93 is set and the output signal Q1 becomes at the High level. However, since the flip-flop 93b is reset, the output Q2 stays at the Low level. Moreover, since the output signal Q1 from the flip-flop 93a becomes at the High level, the stand-by signal MISS bar output from the NOR circuit 94 also becomes at the Low level (active).

When the clock signal rises in the clock cycle period $T_2$, since the stand-by signal MISS bar is asserted at the Low level, the microprocessor determines that the clock cycle period $T_2$ is a stand-by cycle. That is, the microprocessor stands by to read out the data stored in the cell transistors until the sense amplifier group 6 makes the read out data valid.

The output signal Q1 from the flip-flop 93a returns to the Low level at the rise of the clock signal CLK in the clock cycle period $T_2$. However, since the output signal Q2 from the flip-flop 93b changes to the High level, the stand-by signal MISS bar is maintained at the Low level.

During the clock cycle period $T_3$, since the stand-by signal MISS bar becomes at the Low level, the clock cycle period $T_3$ again becomes a stand-by cycle.

Both the output signals Q1 and Q2 from the flip-flops 93a and 93b, respectively, become at the Low level together at the rise of the clock signal CLK in the clock cycle period $T_3$. Consequently, the stand-by signal MISS bar changes to the High level.

Since the stand-by signal MISS bar becomes at the High level (inactive), it becomes possible to take in data $D_0$–$D_n$ output from the semiconductor memory device shown in FIG. 1 into the microprocessor after the clock cycle period $T_3$ ends.

According to the semiconductor memory device of the present invention, once the clock cycle periods $T_2$ and $T_3$ are passed, data stored in the memory cells in the memory array 5 are securely made valid and read out by the sense amplifier group 6.

In a case where there is not sufficient time for determining the data in the clock cycle periods $T_2$ and $T_3$, the period when the stand-by signal MISS bar becomes at the Low level (active) can be increased by increasing the number of stages of the flip-flops 93a and 93b in the generator circuit 93.

Figure 5:
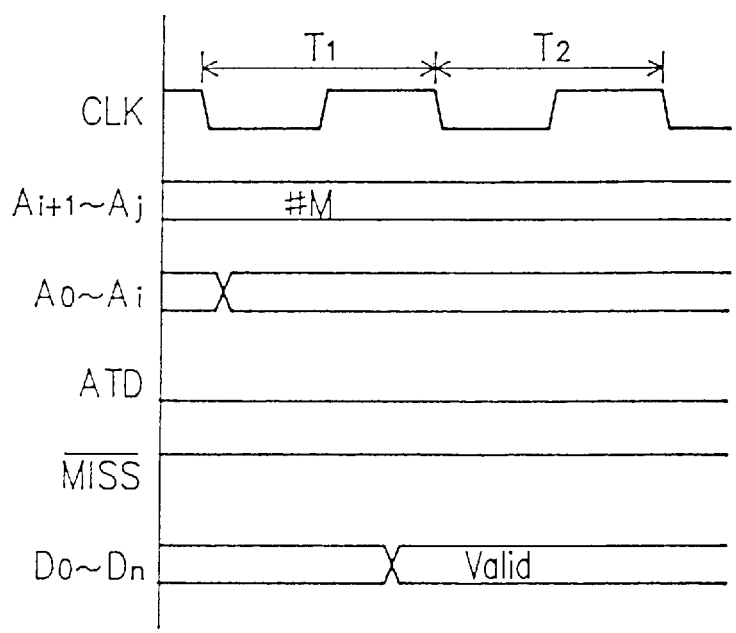
FIG. 5 is a timing chart illustrating the operation of each clock cycle in the high speed access mode in one embodiment of the present invention.
Figure 6:
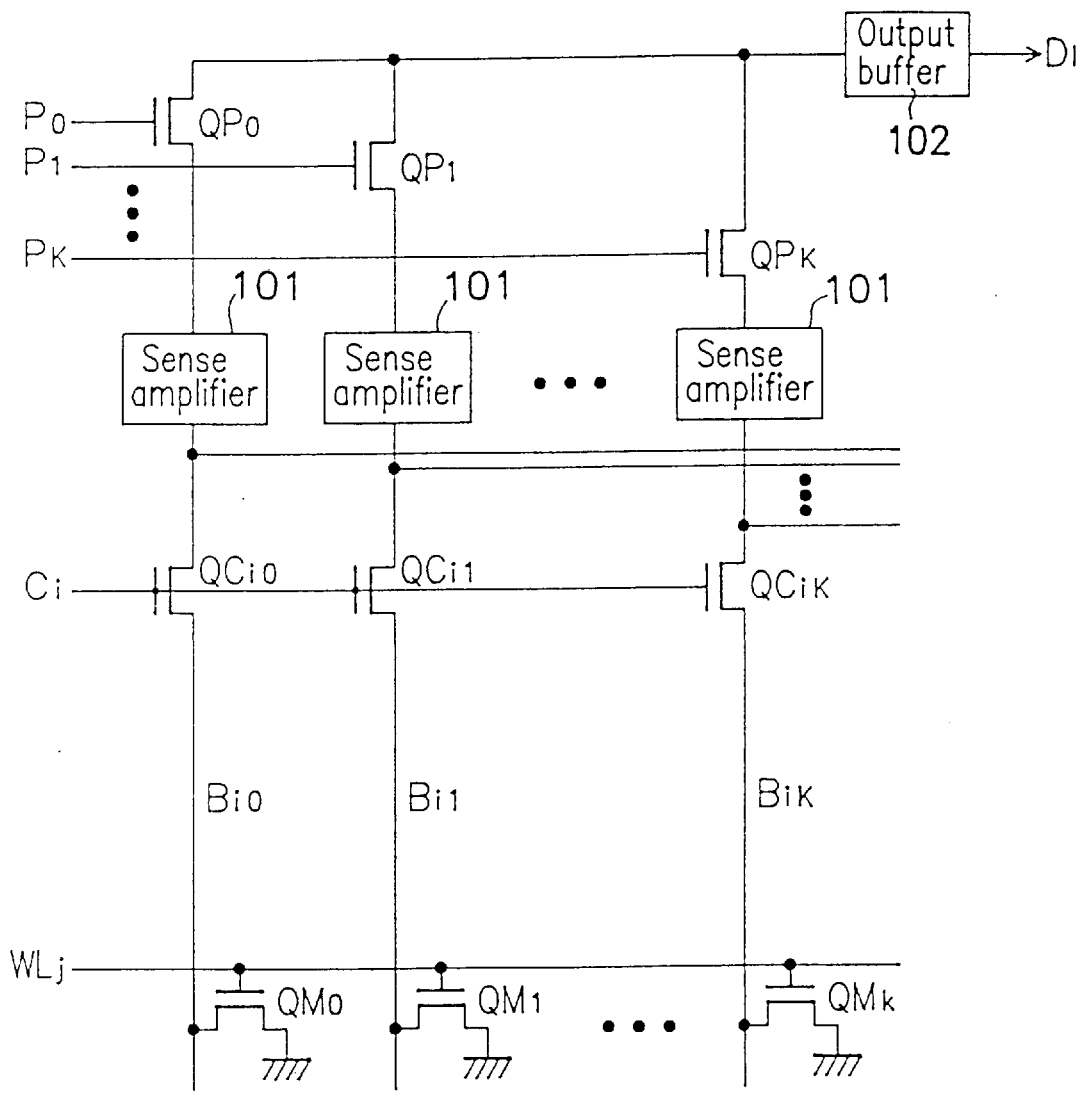
FIG. 6 is a block diagram illustrating the internal structure of a ROM capable of operating in the high speed access mode in the conventional example.
Figure 7:
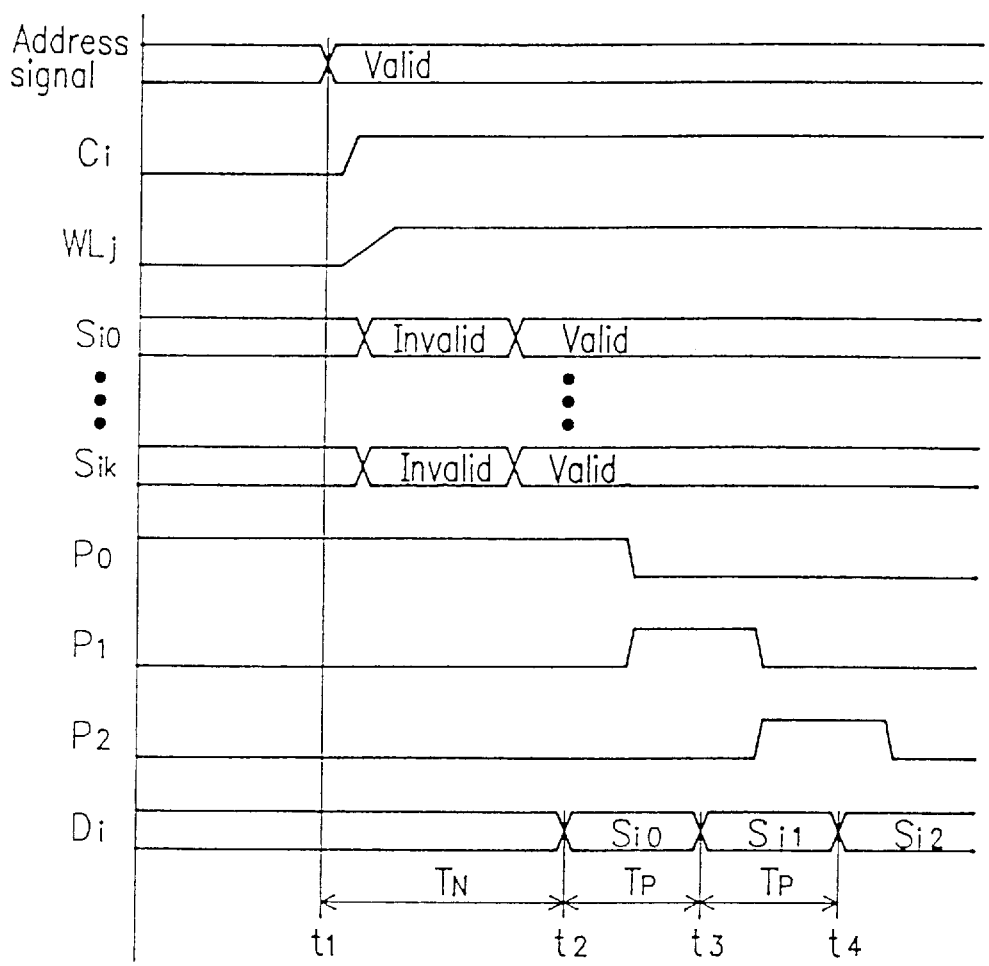
FIG. 7 is a timing chart illustrating the operation of the ROM shown in FIG. 6 in the conventional example.

Hereinafter, the clock cycle of the semiconductor memory device shown in FIG. 1 in the high speed access mode will be described with reference to FIG. 5.

During the first clock cycle period $T_1$, if the first group bits $A_{i+1}$–$A_j$ of the address signal do not change but only the second group bits $A_0$–$A_i$ of the address signal change, the multiplexer 7 changes the connection relationship between the sense amplifier group 6 and the output circuit 8.

The data already read out and made valid by the sense amplifier group 6 in the above-mentioned normal access mode are output from the output circuit 8. For this reason, the data $D_0$–$D_n$ have already become valid until the end of the first clock cycle period $T_1$.

In this case, the address transient detection signal ATD stays at the Low level (inactive), and the stand-by signal MISS bar also stays at the High level (inactive). The microprocessor can immediately take in these data $D_0$–$D_n$ output from the ROM to the inside of the microprocessor or the like without inserting the stand-by cycle period.

The generator circuit 93 may have the following structure. The generator circuit 93 suitably comprises a circuit for initiating and terminating the stand-by period. In particular, generator circuit is suitably configured to receive the ATD and CLK signals and generate the appropriate stand-by signal until the accessed data is determinate. The generator circuit 93 may comprise any circuit for initiating and synchronously terminating the stand-by period as required by the particular device with which it is used.

The semiconductor memory device of the present invention may be a ROM, an EEPROM, a DRAM or the like.

According to the semiconductor memory device of the present invention, by counting the clock signal CLK during the normal access mode, the stand-by signal MISS bar can accurately be made active only for a valid time.

Figure 9:
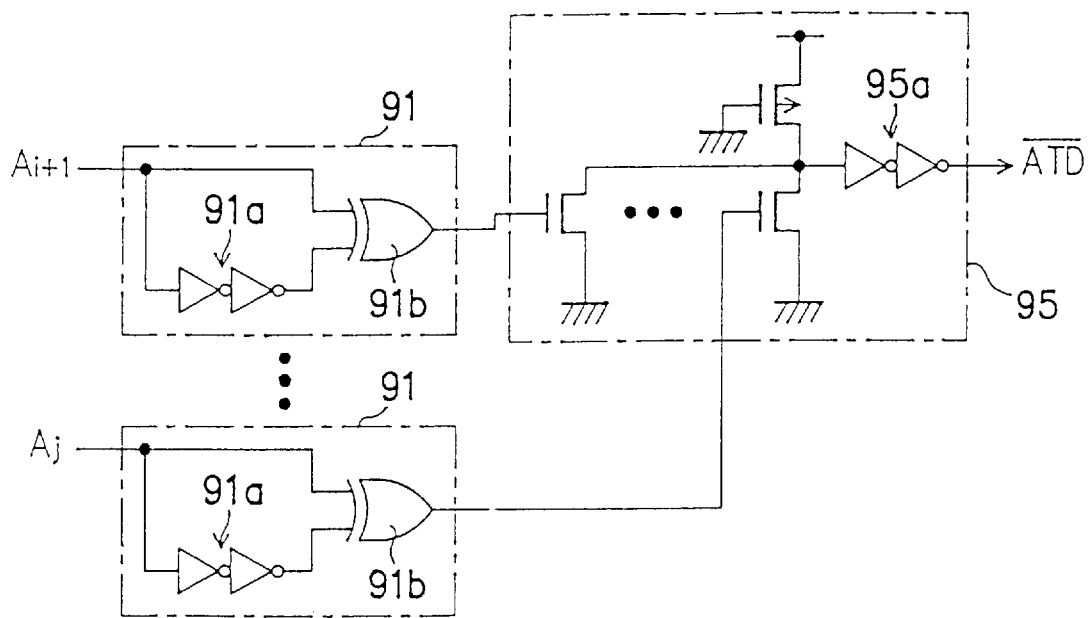
FIG. 9 is a block diagram illustrating the structure of the address transient detection unit in the address transient detection circuit in the conventional example.
Figure 10:
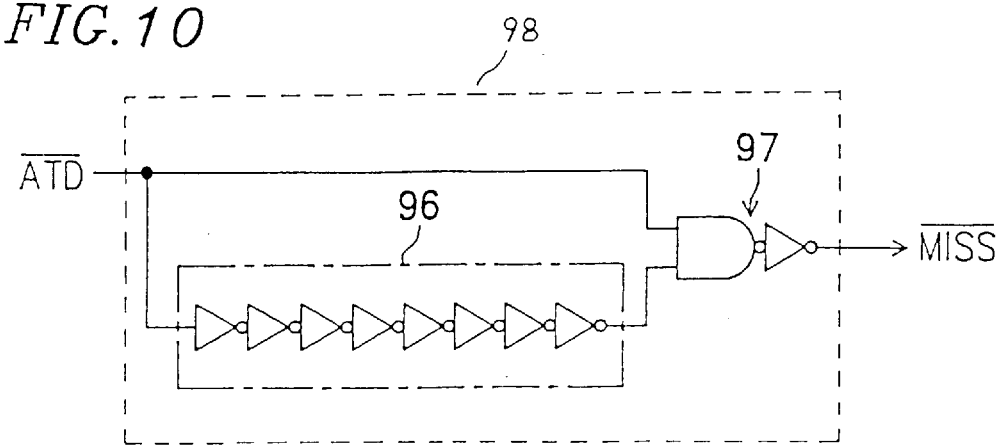
FIG. 10 is a block diagram illustrating the structure of the stand-by signal generating unit in the address transient detection circuit in the conventional example.
Figure 11:
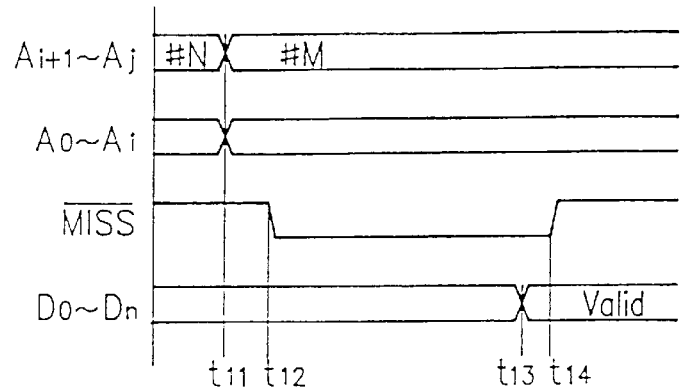
FIG. 11 is a timing chart illustrating the operation in the normal access mode in the conventional example.
Figure 12:
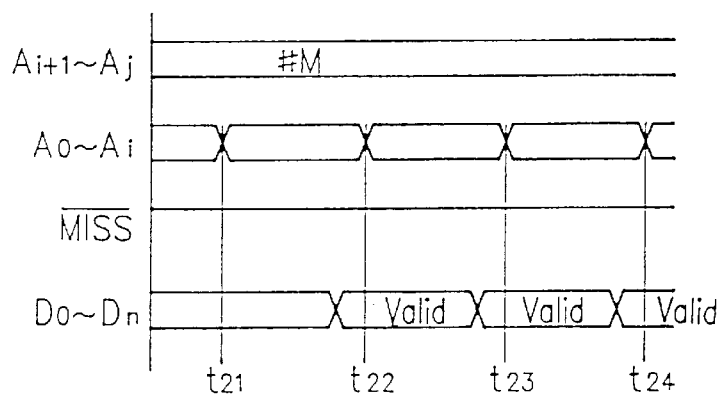
FIG. 12 is a timing chart illustrating the operation in the high speed access mode in the conventional example.
Figure 13:
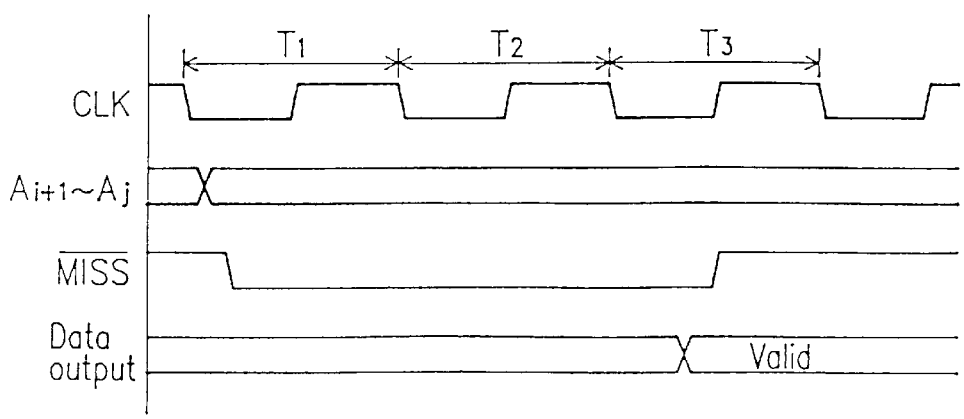
FIG. 13 is a timing chart illustrating the operation of each clock cycle in the normal access mode in the conventional example.

On the other hand, the stand-by signal MISS bar generated by the conventional address transient detection circuit 9 has its pulse width for the Low level (active) made valid by delay times of the delay circuits 91a, 95a and 96 illustrated in FIGS. 9 and 10. The delay circuits 91a, 95a and 96 whose configurations include a combination of inverters or the like have relatively large errors in the delay time due to deviations in production processes or the power source voltage, the ambient temperature or the like. The access time of the ROM also fluctuates due to deviations in production processes or the power source voltage, the ambient temperature or the like. This required that the margin for the delay time of the delay circuits 91a, 95a and 96 be set large and that the delay circuits 91a, 95a and 96 be designed such that the delay time becomes sufficiently long. For this reason, the duration of the stand-by signal MISS bar is set longer than necessary, and the stand-by time of the microprocessor or the like for each access in the normal access mode becomes long, thereby degrading the system performance.

However, it is no longer necessary to design so as to have long delay time while considering deviations of the inverters or the like. This makes the stand-by signal MISS bar active over a long period of time more than required, and the microprocessor does not have to waste its time while standing by.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising a plurality of memory cells for storing data and a selector for selecting at least one memory cell from said plurality of memory cells based on an address signal, said semiconductor memory device comprising:

a transient detecting unit for outputting a first signal in accordance with a transient of said address signal; and a generator for generating a second signal indicating a wait for accessing a memory cell based on said first signal and a clock signal;

wherein said generator includes at least two flip-flops.

2. A semiconductor memory device according to claim 1, wherein said semiconductor memory device is an EEPROM.

3. A semiconductor memory device according to claim 1, wherein said semiconductor memory device is a DRAM.

* * * * *